US012614573B2

(12) United States Patent
Hong et al.

(10) Patent No.: US 12,614,573 B2
(45) Date of Patent: Apr. 28, 2026

(54) IMPEDANCE CALIBRATION CIRCUIT, SEMICONDUCTOR MEMORY APPARATUS AND MEMORY SYSTEM INCLUDING IMPEDANCE CALIBRATION CIRCUIT

(71) Applicant: SK hynix Inc., Icheon-si (KR)

(72) Inventors: Jae Hyeong Hong, Icheon-si (KR); Gwan Woo Kim, Icheon-si (KR); Beom Kyu Seo, Icheon-si (KR); Keun Seon Ahn, Icheon-si (KR); Sung Hwa Ok, Icheon-si (KR); Ji Young Lee, Icheon-si (KR); Jun Seo Jang, Icheon-si (KR); Jae Hoon Jung, Icheon-si (KR); Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 150 days.

(21) Appl. No.: 18/744,987

(22) Filed: Jun. 17, 2024

(65) Prior Publication Data

US 2025/0191623 A1     Jun. 12, 2025

(30) Foreign Application Priority Data

Dec. 7, 2023     (KR) ........................ 10-2023-0176608

(51) Int. Cl.
*G11C 7/10* (2006.01)
*G11C 7/22* (2006.01)
(Continued)

(52) U.S. Cl.
CPC ............ *G11C 7/1057* (2013.01); *G11C 7/222* (2013.01); *G11C 29/023* (2013.01); *H03K 19/0005* (2013.01); *G11C 2207/2254* (2013.01)

(58) Field of Classification Search
CPC ..... G11C 7/1057; G11C 7/222; G11C 29/023; G11C 2207/2254; G11C 7/1084; G11C 29/022; G11C 29/028; G11C 7/1006; G11C 7/1063; G11C 7/1051; G11C 7/22; H03K 19/0005
See application file for complete search history.

(56) References Cited

U.S. PATENT DOCUMENTS 7,872,493 B2 *   1/2011   Kuwahara ............ G11C 29/022
                                                        326/21
2009/0009213 A1 *   1/2009   Osanai ............... H03K 19/0005
                                                        326/30
(Continued)

FOREIGN PATENT DOCUMENTS

KR          101206498 B1     11/2012

*Primary Examiner* — Amir Zarabian
*Assistant Examiner* — Bradley S Coon
(74) *Attorney, Agent, or Firm* — WILLIAM PARK AND ASSOCIATES LTD.

(57) ABSTRACT

An impedance calibration circuit includes a code generation circuit and a code update control circuit. The code generation circuit generates a first impedance code set by performing an impedance adjustment operation within an activated period of a data output enable signal generated in response to a read command. The code update control circuit prevents updating a second impedance code set to the first impedance code set until deactivation of the data output enable signal, wherein the second impedance code set is used in impedance adjustment of a transmitting circuit.

29 Claims, 13 Drawing Sheets

(51) Int. Cl.
  *G11C 29/02* (2006.01)
  *H03K 19/00* (2006.01)

(56) References Cited

U.S. PATENT DOCUMENTS

| | | | |
|---|---|---|---|
| 2010/0207680 A1* | 8/2010 | Kuwahara | H03K 19/017581 |
| | | | 327/520 |
| 2015/0270010 A1* | 9/2015 | Kang | G11C 29/022 |
| | | | 365/185.22 |
| 2022/0122644 A1* | 4/2022 | Hwang | G11C 7/1084 |
| 2023/0231556 A1 | 7/2023 | Jung | |

* cited by examiner

BOOT-UP

SET ZQMODE ← ZQMODE2

ZQCL

TRN

INITIAL TRAINING SEQUENCE

RD

ZQCSi & CMPR

STTRD ← CDV1 or CDV2 OUT

IMPEDANCE CALIBRATION CIRCUIT, SEMICONDUCTOR MEMORY APPARATUS AND MEMORY SYSTEM INCLUDING IMPEDANCE CALIBRATION CIRCUIT

CROSS-REFERENCES TO RELATED APPLICATION

The present application claims priority under 35 U.S.C. § 119(a) to Korean patent application number 10-2023-0176608 filed on Dec. 7, 2023, in the Korean Intellectual Property Office, which application is incorporated herein by reference in its entirety.

BACKGROUND

1. Technical Field

Various embodiments generally relate to a semiconductor circuit, including but not limited to an impedance calibration circuit, a semiconductor memory apparatus including an impedance calibration function, and a memory system including the semiconductor memory apparatus providing an impedance calibration function.

2. Related Art

Recently, electronic systems have become faster, and the data transmission speed between the semiconductor circuits that make up the system is also increasing. For such high-speed data transmission, matching an impedance of a data transmission path and an output impedance of an output circuit becomes more important. Therefore, adjusting the output impedance of the semiconductor circuit to match the impedance of the transmission path and an impedance calibration circuit are utilized for this purpose.

The impedance calibration circuit performs an impedance adjustment operation according to an externally input impedance adjustment command ZQC. The impedance adjustment command ZQC may be divided into a long-term impedance adjustment command ZQCL: ZQ Calibration Long and a short-term impedance adjustment command ZQCS: ZQ Calibration Short, and the distinction between the two is made by a fixed sequence of addresses Ax. ZQCL is a command used to perform an impedance adjustment operation for a longer period of time compared to the time during which an impedance adjustment operation is performed in response to the command ZQCS.

Referring to FIG. 1, a conventional semiconductor memory apparatus includes a boot-up, a ZQCL, and a plurality of training operations TRN in an initial training sequence. After the initial training sequence, a data output operation according to a read command RD and a short-term impedance adjustment operation according to the short-term impedance adjustment command ZQCS are repeated sequentially. Because the data output operation according to the read command RD and the short-term impedance adjustment operation according to the short-term impedance adjustment command ZQCS are performed sequentially, a reduced timing margin problem results during operation of the semiconductor memory apparatus.

SUMMARY

In an embodiment, an impedance calibration circuit may include a code generation circuit and a code update control circuit. The code generation circuit may be configured to generate a first impedance code set by performing an impedance adjustment operation within an activated period of a data output enable signal generated in response to a read command. The code update control circuit may be configured to prevent updating a second impedance code set to the first impedance code set until deactivation of the data output enable signal, wherein the second impedance code set is used in impedance adjustment of a transmitting circuit.

In an embodiment, a semiconductor memory apparatus may include a memory region, a transmitting circuit, an impedance calibration circuit, and a control circuit. The transmitting circuit may be configured to adjust an impedance according to a second impedance code set and may be configured to output data from the memory region during an activated period of a data output enable signal. The impedance calibration circuit may be configured to perform an impedance adjustment operation within the activated period of the data output enable signal to generate a first impedance code set and may be configured to prevent updating the second impedance code set to the first impedance code set until deactivation of the data output enable signal. The control circuit may be configured to activate the data output enable signal in response to a read command.

In an embodiment, a memory system may include a semiconductor memory apparatus and a controller. The semiconductor memory apparatus may comprise a transmitting circuit configured to adjust an impedance according to a second impedance code set, may be configured to perform an impedance adjustment operation within a data output period of the transmitting circuit in response to a read command to generate a first impedance code set, and may be configured to prevent a code update operation from updating the second impedance code set to the first impedance code set until the data output period is completed. The controller may be configured to provide the semiconductor memory apparatus with an impedance control mode setting command to change timing of the code update operation.

BRIEF DESCRIPTION OF THE DRAWINGS

FIG. 11 through FIG. 15 are timing diagrams illustrating impedance adjustment sequences according to one or more embodiments of the present disclosure.

DETAILED DESCRIPTION

Various embodiments of the present disclosure can increase a timing margin for operation of a semiconductor memory apparatus and improve the control efficiency of the memory system. Because a controller operating in connection with the semiconductor memory apparatus knows and participate in information related to the impedance adjustment of the semiconductor memory apparatus, the control efficiency of the memory system is increased compared to a system where a controller does not know and participate in information related to the impedance adjustment of the semiconductor memory apparatus.

One or more embodiments of the present disclosure are described in detail with reference to the accompanying drawings.

Figure 1:
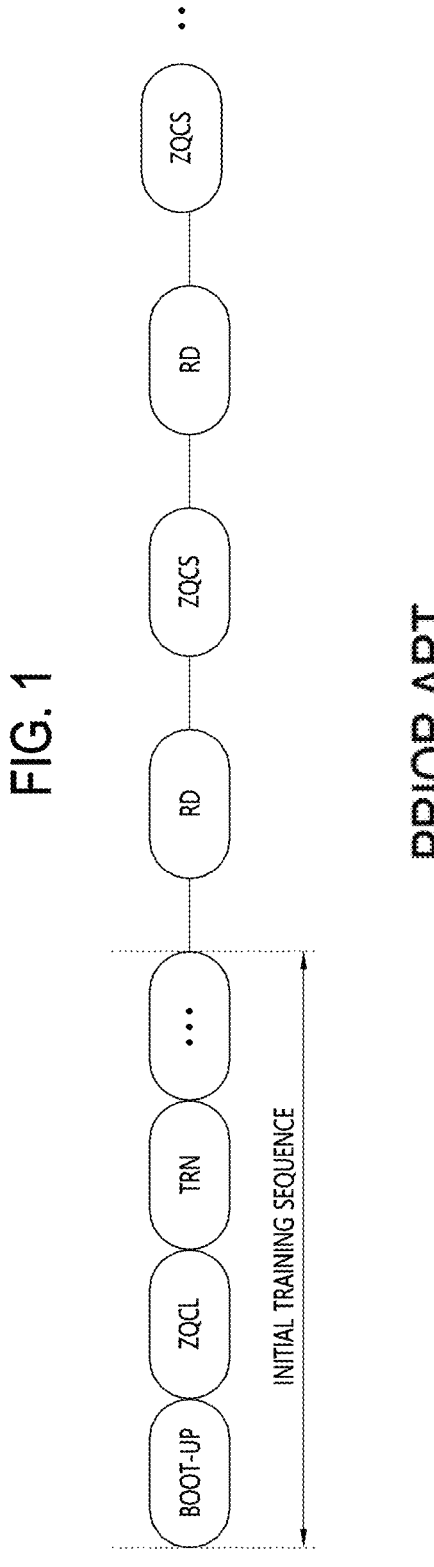
FIG. 1 is a timing diagram illustrating a known impedance adjustment sequence.
Figure 2:
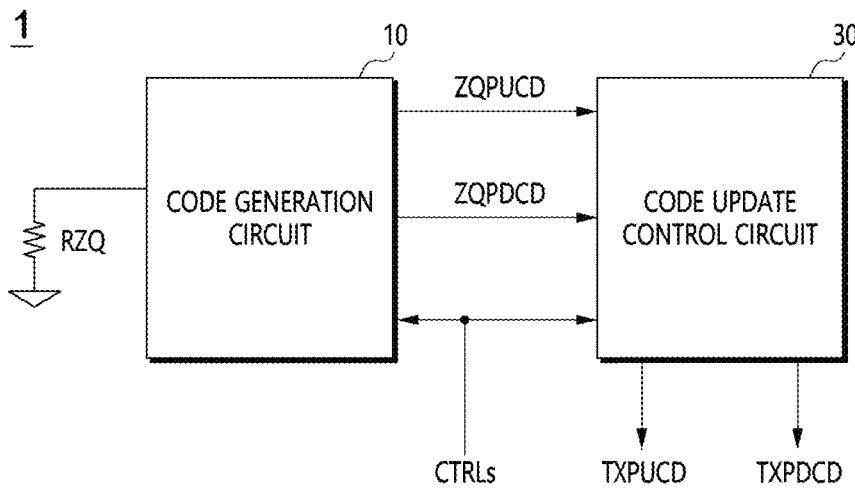
FIG. 2 is a diagram illustrating an impedance calibration circuit according to an embodiment of the present disclosure.

FIG. 2 is a diagram illustrating an impedance calibration circuit 1 according to an embodiment of the present disclosure.

Referring to FIG. 2, the impedance calibration circuit 1 according to an embodiment of the present disclosure includes a code generation circuit 10 and a code update control circuit 30.

Figures 4, 5:
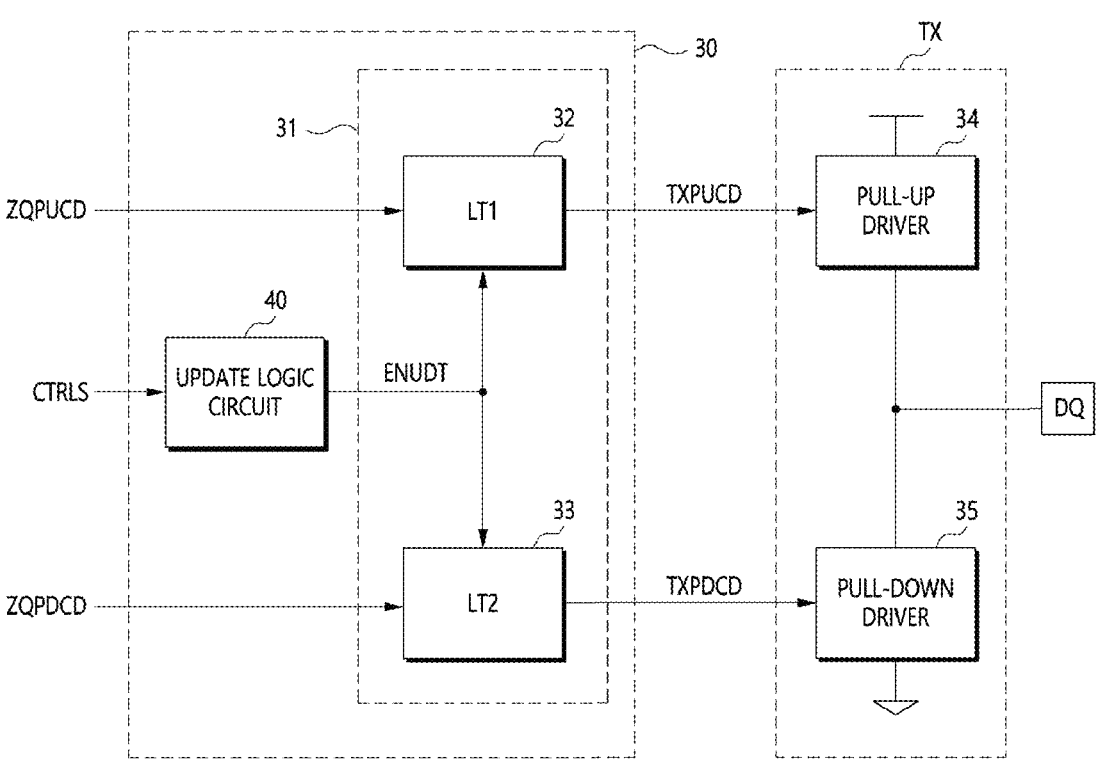
FIG. 4 is a diagram illustrating a code update control circuit according to an embodiment of the present disclosure.
FIG. 5 is a diagram illustrating an update logic circuit according to an embodiment of the present disclosure.

The code generation circuit 10 is coupled to a reference resistor RZQ external to a semiconductor apparatus including the impedance calibration circuit 1. The code generation circuit 10 receives a plurality of control signals CTRLs as input and outputs a first impedance code set ZQPUCD, ZQPDCD. The code generation circuit 10 generates the first impedance code set ZQPUCD, ZQPDCD by performing an impedance adjustment operation during a period within which data is output from a transmitting circuit, for example, TX as shown in FIG. 4, in response to at least one of the plurality of control signals CTRLs. The plurality of control signals CTRLs includes a data output enable signal, such as ENDOUT, that identifies a data output period in response to a read command.

The code update control circuit 30 receives the plurality of control signals CTRLs and the first impedance code set ZQPUCD, ZQPDCD as input and outputs a second impedance code set TXPUCD, TXPDCD. In response to at least one of the plurality of control signals CTRLs, the code update control circuit 30 performs a code update operation to update a previous code value, such as the second impedance code set TXPUCD, TXPDCD, to a current code value, such as the first impedance code set ZQPUCD, ZQPDCD, after completion of data output by the transmitting circuit. In response to at least one of the plurality of control signals CTRLs, the code update control circuit 30 prevents the code update operation until completion of data output by the transmitting circuit. The second impedance code set TXPUCD, TXPDCD is applied to adjust impedance of a transmitting circuit such as TX in FIG. 4.

ZQPUCD is referred to as a first impedance pull-up code, ZQPDCD is referred to as a first impedance pull-down code, TXPUCD is referred to as a second impedance pull-up code, and TXPDCD is referred to as a second impedance pull-down code. The first impedance pull-up code ZQPUCD, the first impedance pull-down code ZQPDCD, the second impedance pull-up code TXPUCD, and the second impedance pull-down code TXPDCD may each include a plurality of bits.

Figure 3:
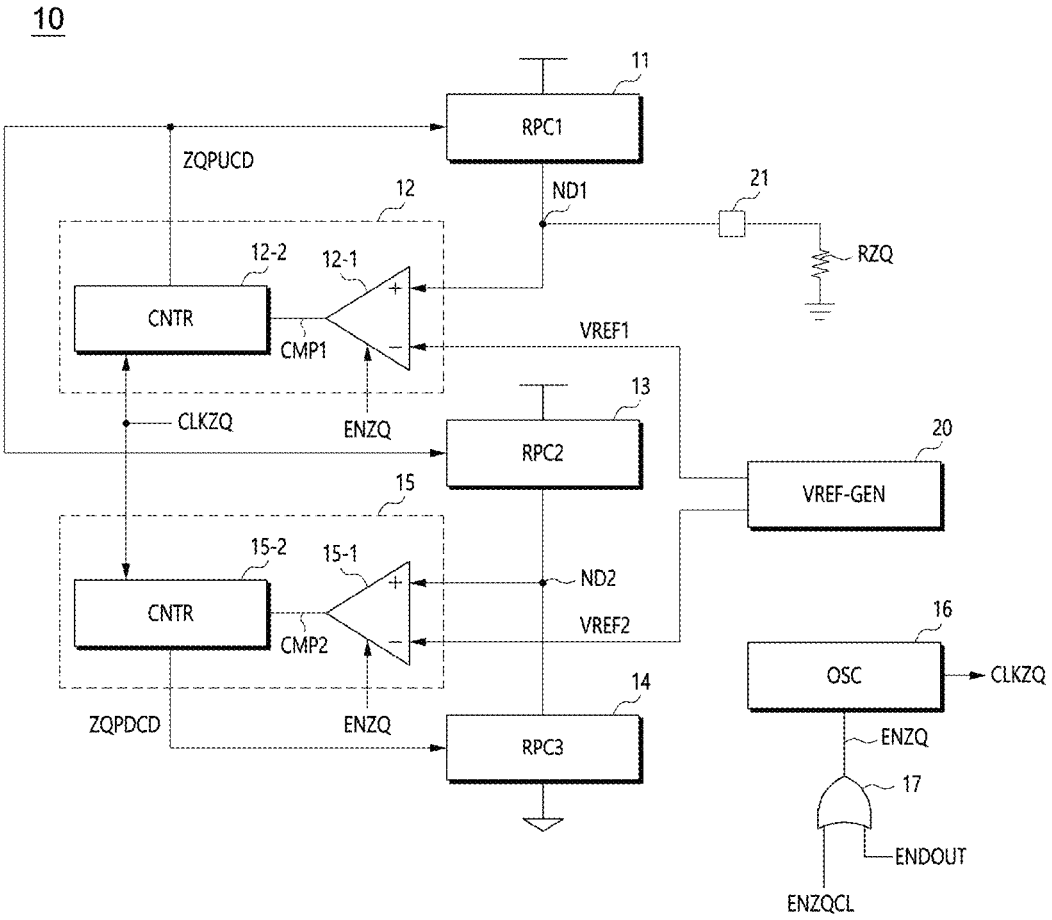
FIG. 3 is a diagram illustrating a code generation circuit according to an embodiment of the present disclosure.

FIG. 3 is a diagram illustrating an embodiment of the code generation circuit 10, for example, as shown in FIG. 2.

Referring to FIG. 3, the code generation circuit 10 receives, from among the plurality of control signals CTRLs, a data output enable signal ENDOUT and a long-term impedance adjustment enable signal ENZQCL. The data output enable signal ENDOUT identifies a data output period, for example, in response to a read command. The long-term impedance adjustment enable signal ENZQCL is generated according to a long-term impedance adjustment command ZQCL and identifies an impedance adjustment period.

The code generation circuit 10 includes a first replication circuit RPC1 11, a first code adjustment circuit 12, a second replication circuit RPC2 13, a third replication circuit RPC3 14, a second code adjustment circuit 15, an oscillator OSC 16, a logic gate 17, and a reference voltage generation circuit VREF-GEN 20.

The first replication circuit 11 is coupled between a power supply terminal and a first node ND1. A reference resistor RZQ is coupled to the first node ND1 through pad 21. The impedance of the first replication circuit 11 is adjusted according to the first impedance pull-up code ZQPUCD. The first replication circuit 11 is configured, for example, by replicating a pull-up driver of a transmitting circuit TX, such as in FIG. 4.

The first code adjustment circuit 12 adjusts a value of the first impedance pull-up code ZQPUCD according to a result from comparing a voltage at the first node ND1 with a first reference voltage VREF1. The first code adjustment circuit 12 includes a comparator 12-1 and a counter CNTR 12-2. The comparator 12-1 outputs a first comparison signal CMP1 that is a result from comparing the voltage at the first node ND1 with the first reference voltage VREF1 during an activated period of the impedance adjustment enable signal ENZQ. The comparator 12-1 determines a bang-bang state of the first comparison signal CMP1 as a lock completion, which bang-bang state comprises, for example, a state including repeating "1" and "0" and stops fluctuation of the first impedance pull-up code ZQPUCD. The counter 12-2 increases and decreases a value of the first impedance pull-up code ZQPUCD to match a level of the first comparison signal CMP1 according to a counting clock signal CLKZQ.

The second replication circuit 13 is coupled between a power supply terminal and a second node ND2. The second replication circuit 13 has an impedance adjusted according to the first impedance pull-up code ZQPUCD. The second replication circuit 13 may be configured substantially similarly to the first replication circuit 11.

The third replication circuit 14 is coupled between the second node ND2 and a ground terminal. The third replication circuit 14 has an impedance adjusted according to the first impedance pull-down code ZQPDCD. The third replication circuit 14 is configured, for example, by replicating a pull-down driver of the transmitting circuit TX, such as in FIG. 4.

The second code adjustment circuit 15 adjusts a value of the first impedance pull-down code ZQPDCD according to a result from comparing a voltage of the second node ND2 with a second reference voltage VREF2. The second code adjustment circuit 15 includes a comparator 15-1 and a counter CNTR 15-2. The comparator 15-1 outputs a second comparison signal CMP2 that is a result from comparing the voltage at the second node ND2 with the second reference voltage VREF2 during an activated period of the impedance adjustment enable signal ENZQ. The comparator 15-1 determines a bang-bang state of the second comparison signal CMP2 as a lock completion and stops fluctuation of the first impedance pull-down code ZQPDCD. The counter 15-2 increases and decreases a value of the first impedance pull-down code ZQPDCD to match a level of the second comparison signal CMP2 according to the counting clock signal CLKZQ.

An oscillator (OSC) 16 generates the counting clock signal CLKZQ during an activated period of the impedance adjustment enable signal ENZQ.

The logic gate 17 outputs the impedance adjustment enable signal ENZQ that is a result from a logical OR operation on the data output enable signal ENDOUT and the long-term impedance adjustment enable signal ENZQCL.

The reference voltage generation circuit 20 generates the first reference voltage VREF1 and the second reference voltage VREF2.

Operation of the code generation circuit 10 is described as follows.

The reference resistor RZQ is configured outside a semiconductor apparatus such that a constant resistance value is maintained regardless of an internal operating environment of the semiconductor apparatus. An operation may be performed to adjust the impedance of the first replication circuit 11 and the second replication circuit 13 with a resistance value of the reference resistor RZQ as a target value. The impedance adjustment enable signal ENZQ is activated during at least one of an activated period of the data output enable signal ENDOUT and an activated period of the long-term impedance adjustment enable signal ENZQCL. During the activated period of the impedance adjustment enable signal ENZQ, the counting clock signal CLKZQ is generated and the first code adjustment circuit 12 and the second code adjustment circuit 15 are activated.

The first code adjustment circuit 12 compares the voltage of the first node ND1 with the first reference voltage VREF1. When the result from the comparison is within a tolerance, the adjustment of the first impedance pull-up code ZQPUCD is completed.

The second code adjustment circuit 15 compares the voltage of the second node ND2 with the second reference voltage VREF2. When the result from the comparison is within a tolerance, the adjustment of the first impedance pull-down code ZQPDCD is completed.

The code generation circuit 10 completes the adjustment of the first impedance code set ZQPUCD, ZQPDCD while data output by the transmitting circuit is performed, that is, within the activated period of the data output enable signal ENDOUT.

The activation/deactivation of signals such as the data output enable signal ENDOUT and the impedance adjustment enable signal ENZQ may be high level/low level or low level/high level. For ease of explanation of the examples described herein, activation of a signal is at a high level, and the deactivation of a signal is at a low level. Similarly, an activated period refers to a period while a signal is activated at a high level.

FIG. 4 is a diagram illustrating an embodiment of the code update control circuit 30, for example, as shown in FIG. 2.

Referring to FIG. 4, the code update control circuit 30 includes a latch circuit 31 and an update logic circuit 40.

The latch circuit 31 performs a code update operation, referring to a change in value of the second impedance code set TXPUCD, TXPDCD to a value of the first impedance code set ZQPUCD, ZQPDCD in response to activation of an update enable signal ENUDT. The latch circuit 31 includes a first latch LT1 32 and a second latch LT2 33. The first latch

32 performs a code update operation by providing the first impedance pull-up code ZQPUCD as the second impedance pull-up code TXPUCD to a pull-up driver 34 of the transmitting circuit TX in response to activation of the update enable signal ENUDT. The second latch 33 performs a code update operation by providing the first impedance pull-down code ZQPDCD as the second impedance pull-down code TXPDCD to a pull-down driver 35 of the transmitting circuit TX in response to activation of the update enable signal ENUDT.

The update logic circuit 40 receives the plurality of control signals CTRLs as input and outputs the update enable signal ENUDT. The update logic circuit 40 may be configured in various ways, and examples 40A, 40B, and 40C are described with reference to FIG. 5 through FIG. 8.

FIG. 5 is a diagram illustrating an update logic circuit 40A according to an embodiment of the present disclosure.

Referring to FIG. 5, the update logic circuit 40A receives the data output enable signal ENDOUT and the long-term impedance adjustment enable signal ENZQCL from among the plurality of control signals CTRLs and outputs the update enable signal ENUDT. The update logic circuit 40A is configured to activate the update enable signal ENUDT when the data output enable signal ENDOUT is deactivated. The update logic circuit 40A is configured to activate the update enable signal ENUDT when the long-term impedance adjustment enable signal ENZQCL is deactivated.

The update logic circuit 40A includes a first signal generation circuit SG1 41, a second signal generation circuit SG2 42, and a logic gate 43.

The first signal generation circuit 41 generates a first preliminary signal PREA1 in the form of a pulse in response to deactivation of the data output enable signal ENDOUT.

The second signal generation circuit 42 generates a second preliminary signal PREA2 in the form of a pulse in response to deactivation of the long-term impedance adjustment enable signal ENZQCL.

The logic gate 43 outputs the update enable signal ENUDT that is a result from a logical OR operation on the first preliminary signal PREA1 and the second preliminary signal PREA2.

Figure 6:
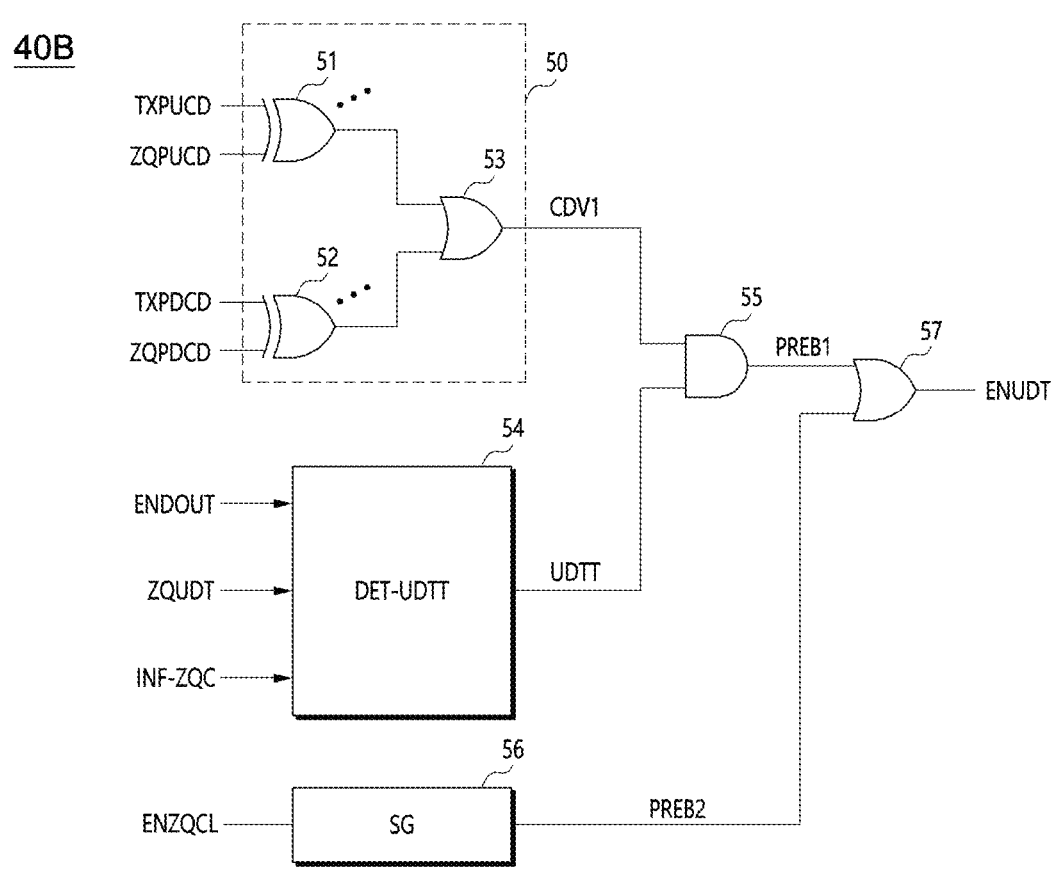
FIG. 6 is a diagram illustrating an update logic circuit according to an embodiment of the present disclosure.

FIG. 6 is a diagram illustrating an update logic circuit 40B according to an embodiment of the present disclosure.

Referring to FIG. 6, the update logic circuit 40B receives the first impedance code set ZQPUCD, ZQPDCD and the second impedance code set TXPUCD, TXPDCD, receives, from among the plurality of control signals CTRLs, the data output enable signal ENDOUT, the long-term impedance adjustment enable signal ENZQCL, a code update command ZQUDT, and a control mode setting signal INF-ZQC, and outputs the update enable signal ENUDT.

The update logic circuit 40B is configured to, when the data output enable signal ENDOUT is deactivated, compare a previous code value, such as a value of the second impedance code set TXPUCD, TXPDCD, and a current code value, such as a value of the first impedance code set ZQPUCD, ZQPDCD, and activate the update enable signal ENUDT when the value of the second impedance code set TXPUCD, TXPDCD does not match the value of the first impedance code set ZQPUCD, ZQPDCD. For example, when TXPUCD does not match ZQPUCD and when TXPDCD does not match ZQPDCD, the update enable signal ENUDT is activated. The update logic circuit 40B is configured to activate the update enable signal ENUDT when the long-term impedance adjustment enable signal ENZQCL is deactivated.

The update logic circuit 40B includes a code operation circuit 50, an update timing detection circuit 54, a signal generation circuit SG 56, a first logic gate 55, and a second logic gate 57.

The code operation circuit 50 compares the values of the first impedance code set ZQPUCD, ZQPDCD with the values of the second impedance code set TXPUCD, TXPDCD to determine whether the values match, and outputs a comparison result as an update determination signal CDV1. The code operation circuit 50 includes a plurality of logic gates 51, 52, 53. A plurality of first logic gates 51 outputs a result from an exclusive logical OR operation on the first impedance pull-up code ZQPUCD and the second impedance pull-up code TXPUCD. A plurality of second logic gates 52 outputs a result from an exclusive logical OR operation on the first impedance pull-down code ZQPDCD and the second impedance pull-down code TXPDCD. In the example of FIG. 6, each of the values of the first impedance code set and the second impedance code set includes three bits, thus the plurality of first logic gates 51 comprises three XOR gates 51 and the plurality of second logic gates 52 comprises three XOR gates 52 as indicated by the series of three dots above each XOR gate 51, 52 in FIG. 6. A third logic gate 53 performs a logical OR operation on an output of the plurality of first logic gates 51 and an output of the plurality of second logic gates 52 and outputs the update determination signal CDV1 that is a result from the logical OR operation.

The update timing detection circuit 54 receives the data output enable signal ENDOUT, the code update command ZQUDT, and the control mode setting signal INF-ZQC as inputs and outputs an update timing signal UDTT.

The first logic gate 55 outputs a first preliminary signal PREB1 that is a result from a logical AND operation on the update determination signal CDV1 and the update timing signal UDTT.

The signal generation circuit 56 generates a second preliminary signal PREB2 in the form of a pulse in response to deactivation of the long-term impedance adjustment enable signal ENZQCL.

The second logic gate 57 outputs the update enable signal ENUDT that is a result from a logical OR operation on the first preliminary signal PREB1 and the second preliminary signal PREB2.

Figure 7:
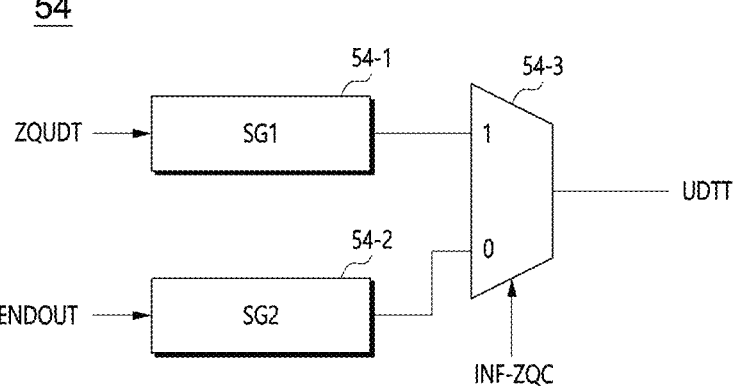
FIG. 7 is a diagram illustrating an update timing detection circuit according to an embodiment of the present disclosure.

FIG. 7 is a diagram illustrating an embodiment of an update timing detection circuit, for example, as shown in FIG. 6.

Referring to FIG. 7, the update timing detection circuit 54 includes a first signal generation circuit SG1 54-1, a second signal generation circuit SG2 54-2, and a multiplexer 54-3.

The first signal generation circuit 54-1 generates a pulse signal in response to receiving the code update command ZQUDT.

The second signal generation circuit 54-2 generates a pulse signal in response to deactivation of the data output enable signal ENDOUT.

The multiplexer 54-3 outputs the update timing signal UDTT that is either an output of the first signal generation circuit 54-1 or an output of the second signal generation circuit 54-2 according to the control mode setting signal INF-ZQC.

The control mode setting signal INF-ZQC is a signal that identifies one of a first impedance control mode ZQMODE1, in which a code update operation is performed by a semiconductor memory apparatus, and a second impedance control mode ZQMODE2, in which a code update operation is performed according to a command received from outside the semiconductor memory apparatus as an operation mode of the semiconductor apparatus. A value of the control mode setting signal INF-ZQC is established according to an impedance control mode setting command provided from outside the semiconductor apparatus. When the control mode setting signal INF-ZQC is '0' (low level), the operation mode of the semiconductor apparatus is the first impedance control mode ZQMODE1, and when the control mode setting signal INF-ZQC is '1' (high level), the operation mode of the semiconductor apparatus is the second impedance control mode ZQMODE2.

The multiplexer 54-3 output the output of the second signal generation circuit 54-2 as the update timing signal UDTT when the control mode setting signal INF-ZQC is at a low level and outputs the output of the first signal generation circuit 54-1 as the update timing signal UDTT when the control mode setting signal INF-ZQC is at a high level.

Figure 8:
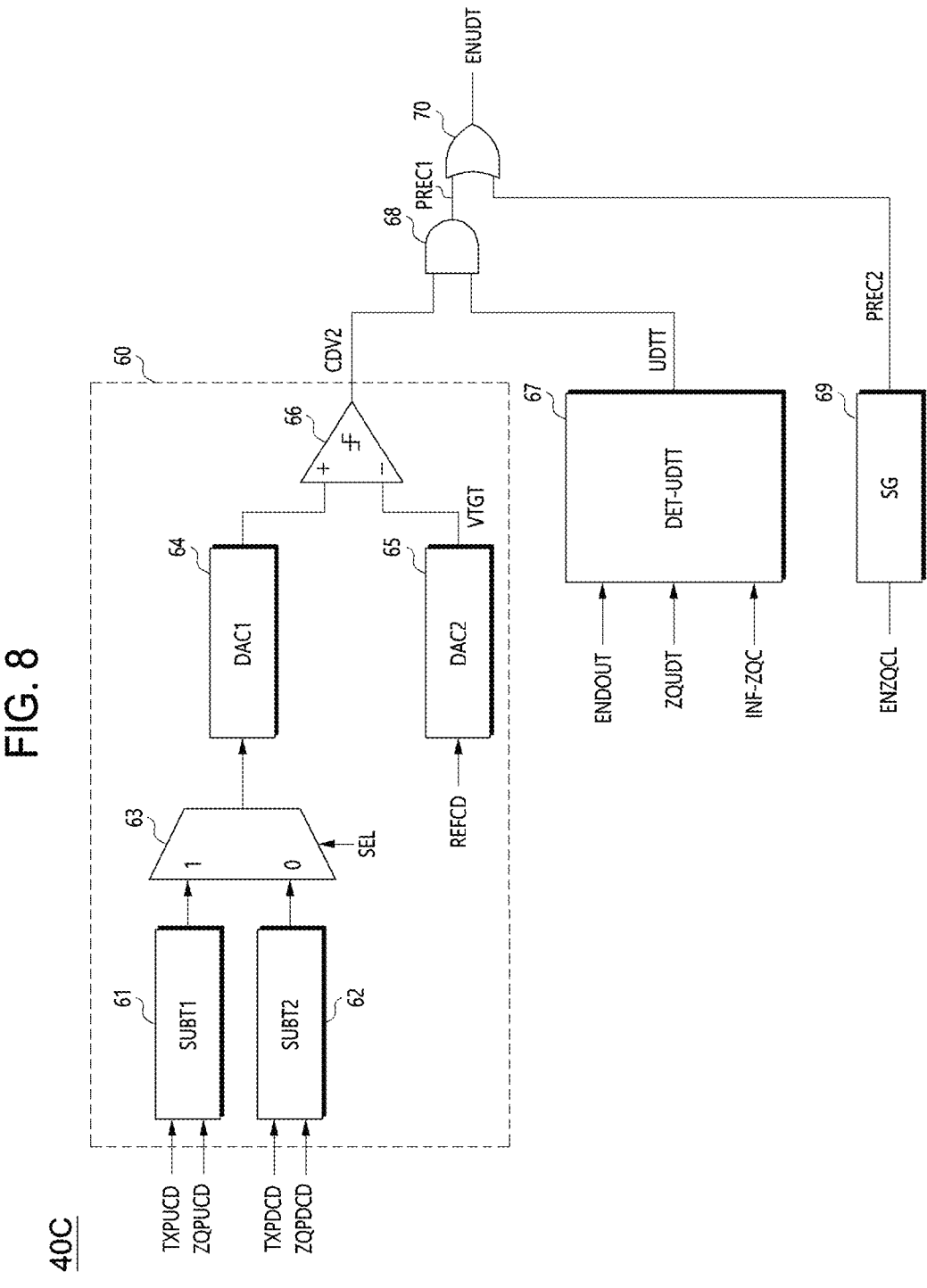
FIG. 8 is a diagram illustrating an update logic circuit according to an embodiment of the present disclosure.

FIG. 8 is a diagram illustrating an update logic circuit 40C according to an embodiment of the present disclosure.

Referring to FIG. 8, the update logic circuit 40C receives a selection signal SEL, a reference code REFCD, the first impedance code set ZQPUCD, ZQPDCD and the second impedance code set TXPUCD, TXPDCD, receives, from among the plurality of control signals CTRLs, the data output enable signal ENDOUT, the long-term impedance adjustment enable signal ENZQCL, the code update command ZQUDT, and the control mode setting signal INF-ZQC, and outputs the update enable signal ENUDT.

The update logic circuit 40C is configured to activate the update enable signal ENUDT when the data output enable signal ENDOUT is deactivated and a difference between values of the first impedance code set ZQPUCD, ZQPDCD and the second impedance code set TXPUCD, TXPDCD is greater than a target value. The update logic circuit 40C is configured to enable the update enable signal ENUDT when the long-term impedance adjustment enable signal ENZQCL is deactivated.

The update logic circuit 40C includes a code operation circuit 60, an update timing detection circuit 67, a signal generation circuit SG 69, a first logic gate 68, and a second logic gate 70.

The code operation circuit 60 calculates a difference value between the first impedance code set ZQPUCD, ZQPDCD and the second impedance code set TXPUCD, TXPDCD and outputs an update determination signal CDV2 that is a result from determining whether the difference value is greater than a target value. The code operation circuit 60 includes a first subtractor SUBT1 61, a second subtractor SUBT2 62, a multiplexer 63, a first digital-to-analog converter DAC1 64, a second digital-to-analog converter DAC2 65, and a comparator 66. The first subtractor 61 detects a difference value between the first impedance pull-up code ZQPUCD and the second impedance pull-up code TXPUCD. The second subtractor 62 detects a difference value between the first impedance pull-down code ZQPDCD and the second impedance pull-down code TXPDCD. The multiplexer 63 selects and outputs one of the outputs of the first subtractor 61 and the second subtractor 62 according to the selection signal SEL. The first digital-to-analog converter 64 converts an output of the multiplexer 63 to an analog voltage and outputs the resulting analog voltage to the comparator 66. The second digital-to-analog converter 65 converts the reference code REFCD to an analog voltage to generate a target value VTGT. The comparator 66 outputs the update determination signal CDV2 that is a result from comparing an output of the first digital-to-analog converter 64 and the target value VTGT. The comparator 66 activates the update determination signal CDV2 when a voltage level of the output of the first digital-to-analog converter 64 is higher than the target value VTGT.

The update timing detection circuit 67 receives the data output enable signal ENDOUT, the code update command ZQUDT, and the control mode setting signal INF-ZQC as inputs and outputs the update timing signal UDTT. The update timing detection circuit 67 may be configured similarly to the update timing detection circuit 54 of FIG. 7.

The first logic gate 68 outputs a first preliminary signal PREC1 that is a result from a logical AND operation on the update determination signal CDV2 and the update timing signal UDTT.

The signal generation circuit 69 generates a second preliminary signal PREC2 in the form of a pulse in response to deactivation of the long-term impedance adjustment enable signal ENZQCL.

The second logic gate 70 outputs the update enable signal ENUDT that is a result from a logical OR operation on the first preliminary signal PREC1 and the second preliminary signal PREC2.

Figure 9:
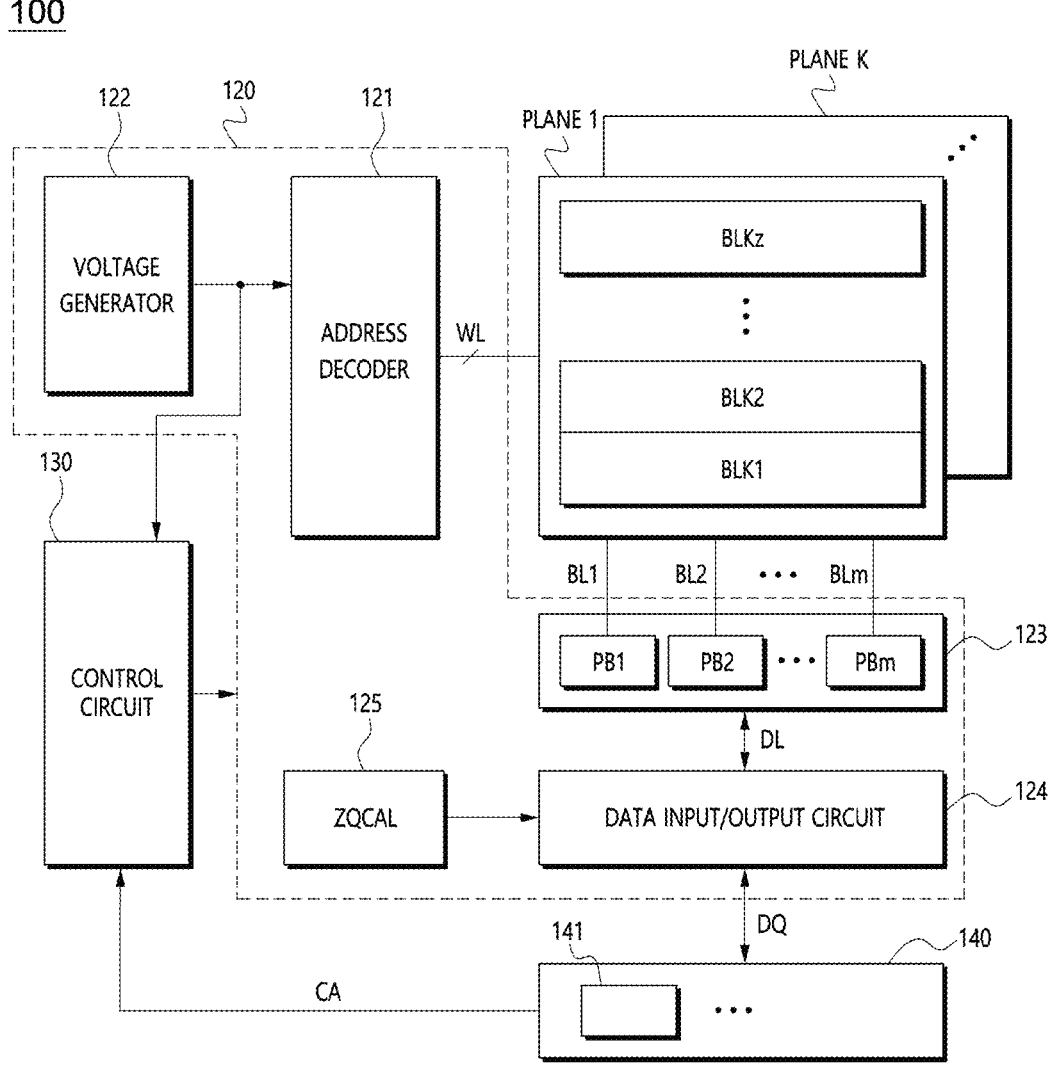
FIG. 9 is a diagram illustrating a semiconductor memory apparatus according to an embodiment of the present disclosure.

FIG. 9 is a diagram illustrating a semiconductor memory apparatus 100 according to an embodiment of the present disclosure.

Referring to FIG. 9, the semiconductor memory apparatus 100 includes a memory region or area including a plurality of planes Plane 1 through Plane k, a peripheral circuit 120, a control circuit 130, and an input/output pad circuit 140.

Each of the plurality of planes Plane 1 through Plane k includes memory cell arrays, is coupled to an address decoder 121 through wordlines WL and is coupled to a read/write circuit 123 through bitlines BL1 through BLm, where k and m are positive integers. Each of the plurality of planes Plane 1 through Plane k includes a plurality of memory blocks BLK1 through BLKz, where z is a positive integer. The plurality of memory blocks BLK1 through BLKz is coupled to the address decoder 121 through the wordlines WL. The plurality of memory blocks BLK1 through BLKz is coupled to the read/write circuit 123 through the bitlines BL1 through BLm. Each of the plurality of memory blocks BLK1 through BLKz includes a plurality of memory cells. The plurality of memory cells may be non-volatile memory cells. The plurality of memory blocks BLK1 through BLKz may include a plurality of pages. Among the plurality of memory cells, memory cells associated with the same wordline may be configured as one page. The plurality of memory blocks BLK1 through BLKz may store normal data, such as data transmitted and received during a normal read/write operation. Each memory cell may be a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 includes an address decoder 121, a voltage generator 122, a read/write circuit 123, a data input/output circuit 124, and an impedance calibration circuit ZQCAL 125. The read/write circuit 123 includes a plurality of page buffers PB1 through PBm. The data input/output circuit 124 includes the transmitting circuit TX described with reference to FIG. 4. The impedance calibration circuit 125 may be configured to perform an impedance adjustment operation similar to the impedance calibration circuit 1 described with reference to FIG. 2 through FIG. 8.

The address decoder 121 is coupled to the plane 1 through the wordlines WL. The address decoder 121 is configured to operate in response to control by the control circuit 130. The address decoder 121 is provided with addresses by the control circuit 130. The address decoder 121 selects at least one memory block of the memory blocks BLK1 through BLKz based on a decoded address. The address decoder 121 is configured to decode a row address from the received addresses. The address decoder 121 selects at least one wordline of the selected memory block by applying voltages provided by the voltage generator 122 to at least one wordline WL according to the decoded row address. The address decoder 121 performs a program operation by applying a program voltage to the selected wordline and a pass voltage at a lower level relative to the program voltage to non-selected wordlines. The address decoder 121 performs a read operation by applying a read voltage to the selected wordline and a pass voltage higher than the read voltage to non-selected wordlines.

The voltage generator 122 generates and provide to the address decoder 121 various voltages, such as a read voltage, a pass voltage, a program voltage, and an erase voltage, which voltages are used during operation of the semiconductor memory apparatus 100 under control of the control circuit 130.

The plurality of page buffers PB1 through PBm is coupled to plane 1 through the bitlines BL1 through BLm. The plurality of page buffers PB1 through PBm operates in response to a control signal received from the control circuit 130. The plurality of page buffers PB1 through PBm performs data communication with the data input/output circuit 124. The plurality of page buffers PB1 through PBm performs a program operation by receiving data to be stored through the data input/output circuit 124 and the data lines DL and providing the data to the plane 1. The read/write circuit 123 performs a read operation by reading data from memory cells of a selected page through the bitlines BL1 through BLm and outputting the read data to the data input/output circuit 124. The read/write circuit 123 may perform an erase operation by floating the bitlines BL1 through BLm.

The data input/output circuit 124 is coupled between the plurality of page buffers PB1 through PBm and the input/output pad circuit 140. The data input/output circuit 124 performs data input operations and data output operations in response to control signals received from the control circuit 130. The data input/output circuit 124 outputs data transmitted from the plurality of memory blocks BLK1 through BLKz through the plurality of page buffers PB1 through PBm during a read operation via the input/output pad circuit 140. The data input/output circuit 124 transmits data input via the input/output pad circuit 140 to the plurality of page buffers PB1 through PBm during a write operation. The data input/output circuit 124 outputs status information transmitted by the control circuit 130 to an external device through the input/output pad circuit 140 during a read operation for the status information.

The control circuit 130 is coupled with the address decoder 121, the voltage generator 122, the read/write circuit 123, the data input/output circuit 124, the impedance calibration circuit 125, and the input/output pad circuit 140. The control circuit 130 receives commands, addresses, and clock signals, collectively referred to as "CA" from the input/output pad circuit 140. The control circuit 13 generates various control signals in response to the commands.

The control circuit 130 generates the data output enable signal ENDOUT in response to a read command, the long-term impedance adjustment enable signal ENZQCL in response to a long-term impedance adjustment command, and the control mode setting signal INF-ZQC in response to an impedance control mode setting command.

The control circuit 130 outputs the first impedance code set ZQPUCD, ZQPDCD and the second impedance code set TXPUCD, TXPDCD to outside the semiconductor memory apparatus 100 through the input/output pad circuit 140 in response to a code read command provided from outside the semiconductor memory apparatus 100.

The control circuit 130 outputs the update determination signal CDV1 or CDV2 as a flag signal to outside the semiconductor memory apparatus 100 through the input/output pad circuit 140 according to an externally provided code status read command.

The input/output pad circuit 140 includes a plurality of pads 141 configured to receive commands, addresses, and clock signals, and to input and output data DQ. The commands and addresses may be input separately according to SCA (Separate Command Address) method or in an integrated form according to CA (Command and Address) method.

Figure 10:
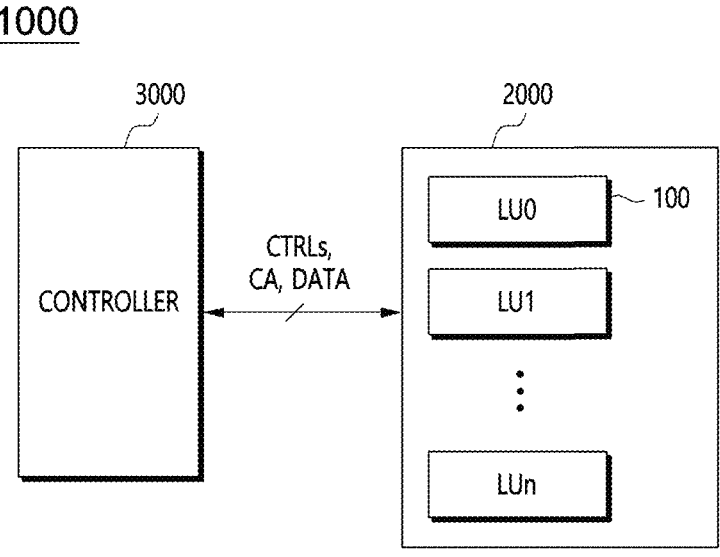
FIG. 10 is a diagram illustrating a memory system according to an embodiment of the present disclosure.

FIG. 10 is a diagram illustrating a memory system 1000 according to an embodiment of the present disclosure.

Referring to FIG. 10, the memory system 1000 may include a semiconductor memory apparatus 2000 and a controller 3000.

The semiconductor memory apparatus 2000 includes a plurality of logic units LU0 through Lun, where n is a positive integer. Each of the plurality of logic units LU0 through LUn includes at least one memory die. The semiconductor memory apparatus 100 according to an embodiment of the present disclosure described with reference to FIG. 9 is any one of the plurality of logic units LU0 through LUn.

The controller 3000 generates and provides a plurality of control signals CTRLs and commands to the semiconductor memory apparatus 2000. The controller 3000 transmits data to and receives data from the memory device 2000 during a read operation and a write operation. The controller 3000 provides various commands CA related to impedance adjustment operations, such as the read command RD, the impedance adjustment command ZQCL, the impedance control mode setting command SETZQMODE, the code read command ZQRD, and the code status read command STTRD to the semiconductor memory apparatus 2000. The controller 3000 provides the code update command ZQUDT to the semiconductor memory apparatus 2000 in response to determining whether to update based on information provided by the semiconductor memory apparatus 2000 according to the code read command ZQRD and the code status read command STTRD.

FIG. 11 through FIG. 15 are diagrams illustrating impedance adjustment sequences methods according to one or more embodiments of the present disclosure.

Figure 11:
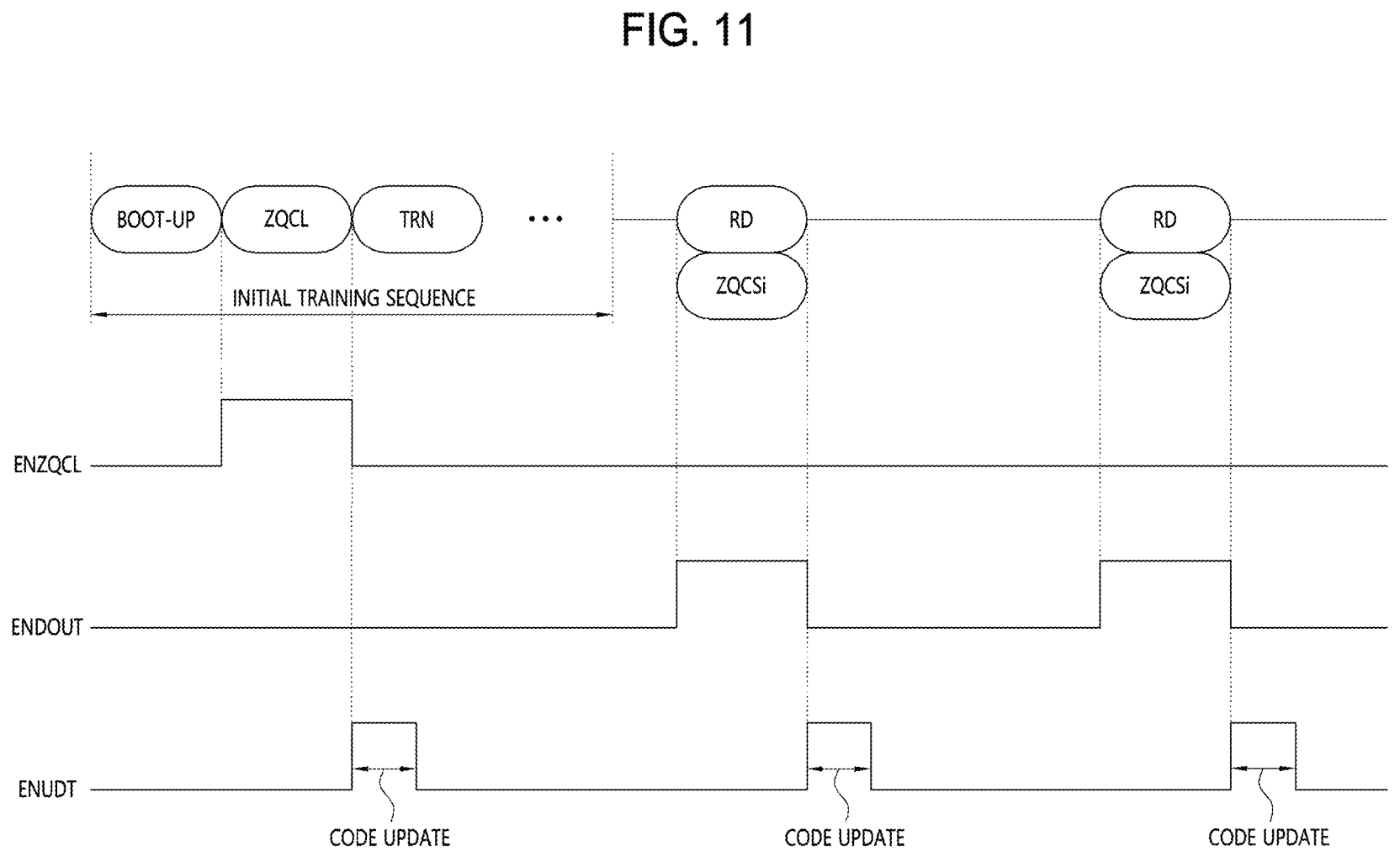

FIG. 11 is a timing diagram illustrating an impedance adjustment sequence according to an impedance adjustment operation of the semiconductor memory apparatus 2000, which impedance adjustment operation is independent of control external to the controller 3000.

Referring to FIG. 11, an initial training sequence including a boot-up sequence, a long-term impedance adjustment operation according to the long-term impedance adjustment command ZQCL, and a plurality of training operations TRNs is performed. The semiconductor memory apparatus 2000 activates the long-term impedance adjustment enable signal ENZQCL according to the long-term impedance adjustment command ZQCL, and the long-term impedance adjustment operation is performed during a period during which the impedance adjustment enable signal ENZQCL is activated. The semiconductor memory apparatus 2000 performs a code update operation in response to deactivation of the long-term impedance adjustment enable signal ENZQCL at which time the update enable signal ENUDT is activated.

After the initial training sequence, the controller 3000 provides a read command RD to the semiconductor memory apparatus 2000.

The semiconductor memory apparatus 2000 activates the data output enable signal ENDOUT in response to receiving the read command RD and performs data output operation during an activated period of the data output enable signal ENDOUT.

In addition, the semiconductor memory apparatus 2000 performs an impedance adjustment operation, such as a short-term impedance adjustment operation ZQCSi, simultaneously with the data output operation.

The semiconductor memory apparatus 2000 performs the short-term impedance adjustment operation ZQCSi within the activated period of the data output enable signal ENDOUT. Unlike conventional methods, the methods of the present disclosure do not require the controller 3000 to provide the short-term impedance adjustment command ZQCS, and the semiconductor memory apparatus 2000 performs the short-term impedance adjustment operation ZQCSi within the activated period of the data output enable signal ENDOUT without the short-term impedance adjustment command ZQCS.

The semiconductor memory apparatus 2000 performs the code update operation to update a value of the second impedance code set TXPUCD, TXPDCD described above to a value of the first impedance code set ZQPUCD, ZQPDCD in response to the deactivation of the data output enable signal ENDOUT at which time the update enable signal ENUDT is activated.

Thereafter, the short-term impedance adjustment operation ZQCSi and the code update operation may be performed each time the read command RD is input.

Figure 12:
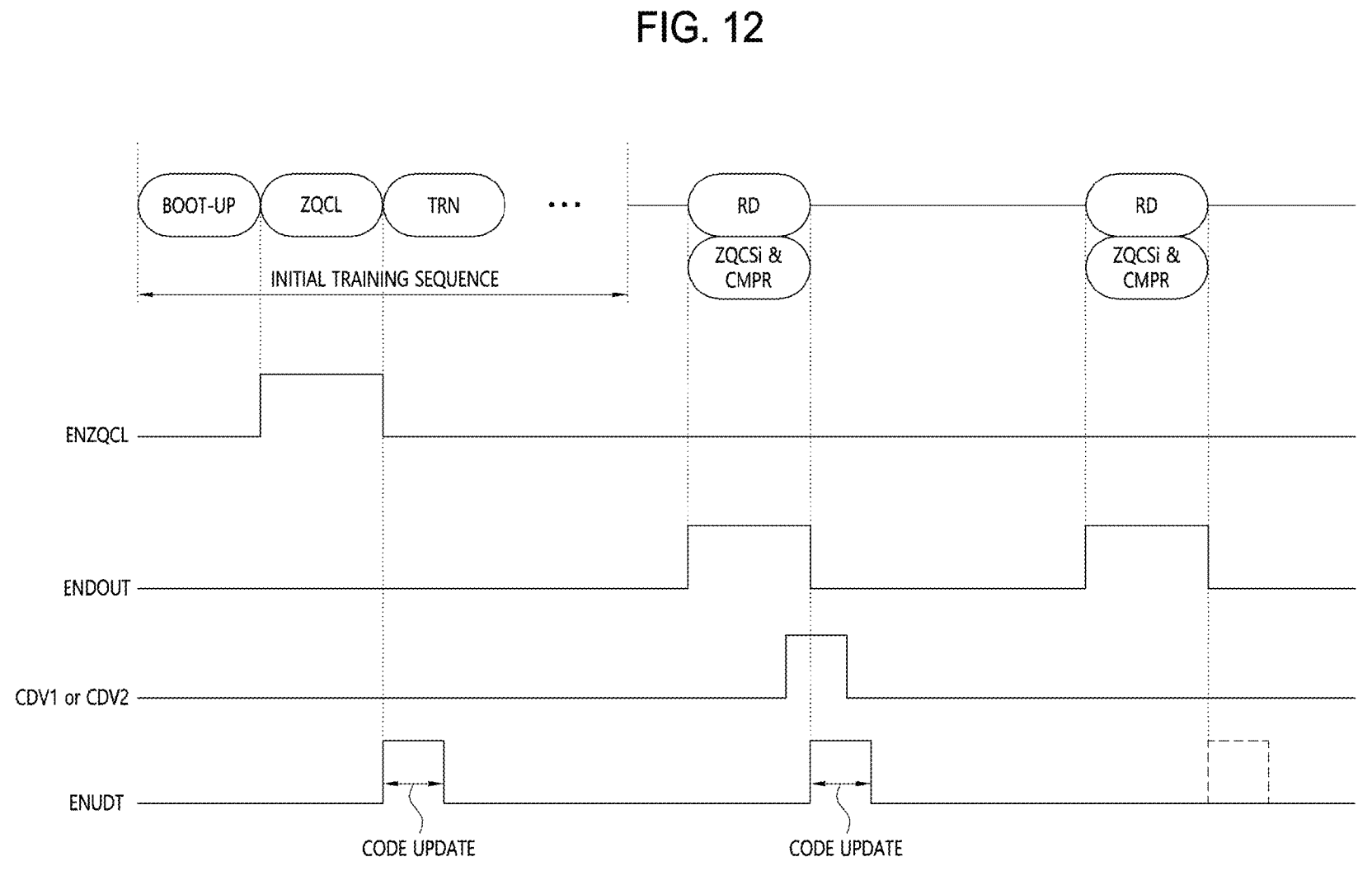

FIG. 12 is a timing diagram illustrating an impedance adjustment sequence according to an impedance adjustment operation of the semiconductor memory apparatus 2000 which impedance adjustment operation is independent of control external to the controller 3000.

Referring to FIG. 12, an initial training sequence including an initial training sequence similar to the initial training sequence of FIG. 11 is performed.

After the initial training sequence, the controller 3000 provides the read command RD to the semiconductor memory apparatus 2000.

The semiconductor memory apparatus 2000 activates the data output enable signal ENDOUT according to the read command RD and performs a data output operation during the activated period of the data output enable signal ENDOUT.

The semiconductor memory apparatus 2000 performs a short-term impedance adjustment and comparison operation ZQCSi & CMPR simultaneously with the data output operation. The short-term impedance adjustment and comparison operation ZQCSi & CMPR includes generating the update determination signal CDV1 or CDV2 utilizing the short-term impedance adjustment operation ZQCSi and the code comparison as described with reference to FIG. 6 and FIG. 8.

The semiconductor memory apparatus 2000 performs the short-term impedance adjustment and comparison operation ZQCSi & CMPR within the activated period of the data output enable signal ENDOUT. Unlike conventional methods, the methods of the present disclosure do not require the controller 3000 to provide the short-term impedance adjustment command ZQCS, and the semiconductor memory apparatus 2000 performs the short-term impedance adjustment and comparison operation ZQCSi & CMPR within the activated period of the data output enable signal ENDOUT without the short-term impedance adjustment command ZQCS.

The semiconductor memory apparatus 2000 performs the code update operation described above in response to deactivation of the data output enable signal ENDOUT, at which time the update enable signal ENUDT is activated, and while the update determination signal CDV1 or CDV2 is activated. The semiconductor memory apparatus 2000 may not perform the code update operation when the update determination signal CDV1 or CDV2 is deactivated.

Thereafter, the short-term impedance adjustment and comparison operation ZQCSi & CMPR and the code update operation described above may be performed each time the read command RD is input.

Figure 13:
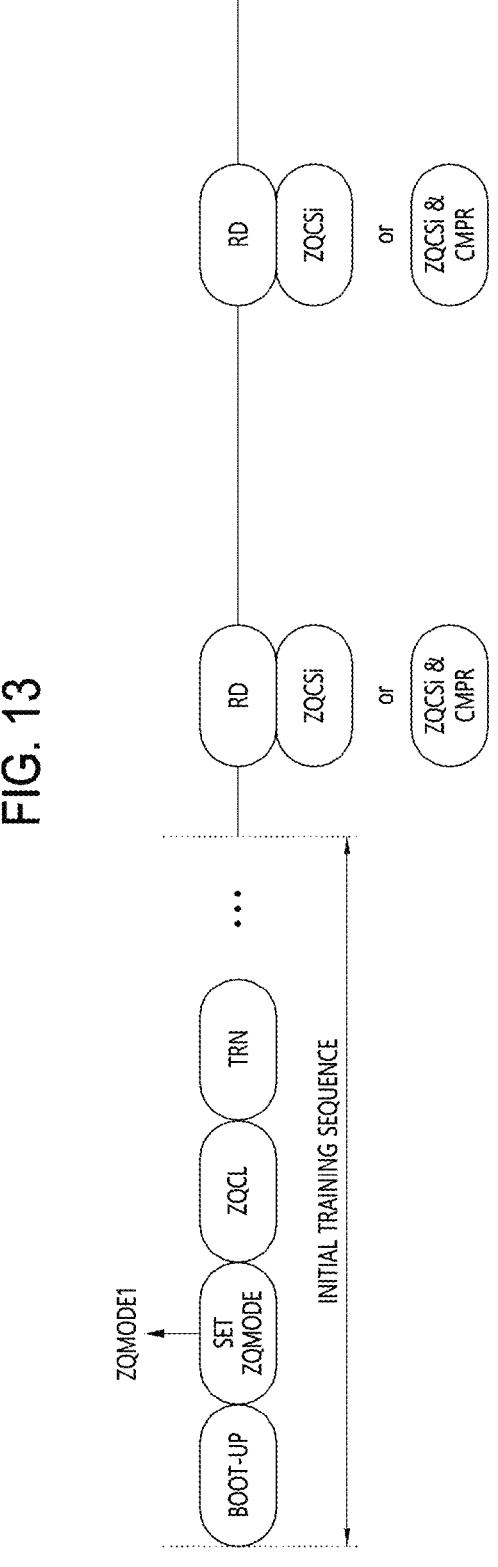
Figure 14:
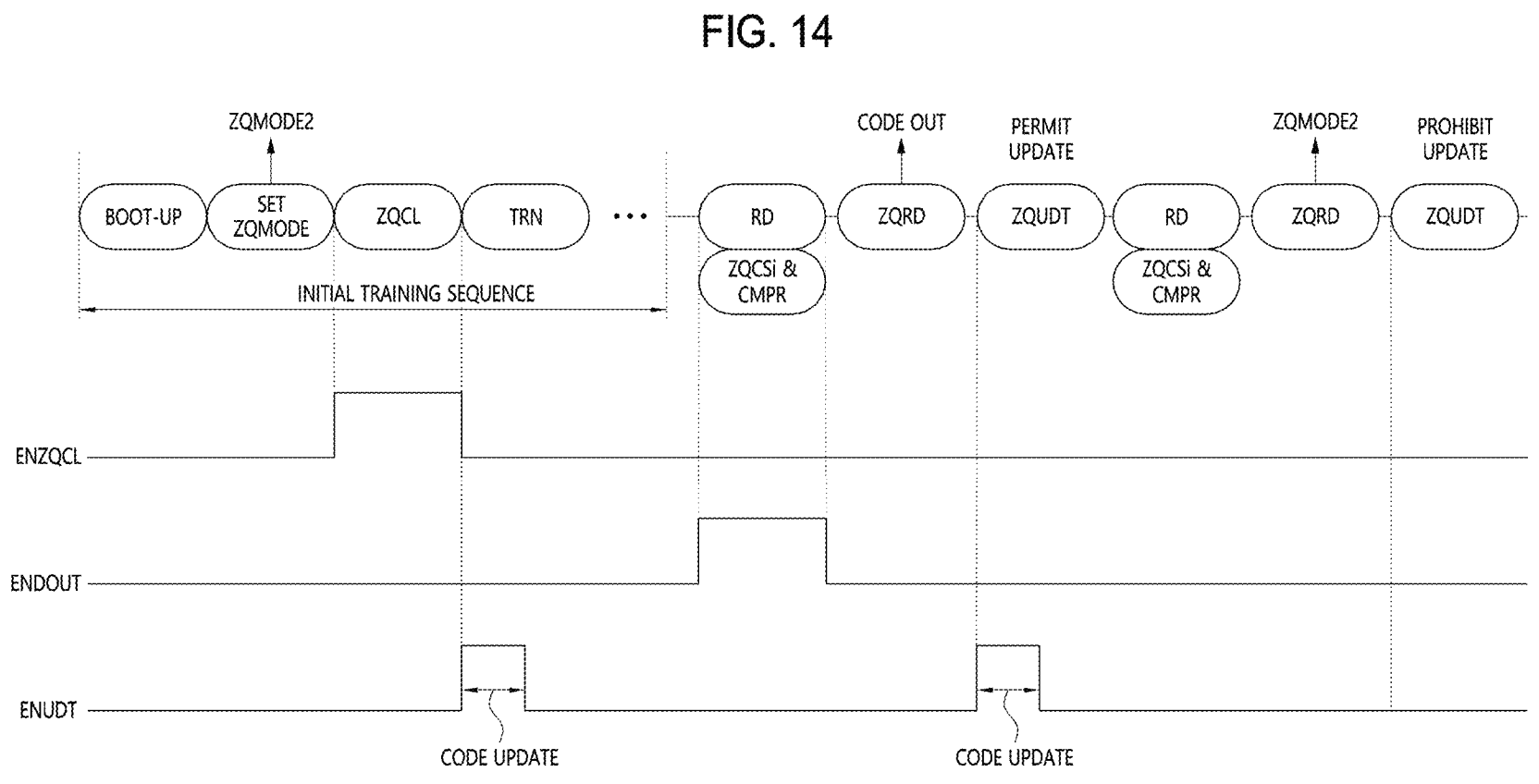

FIG. 13 and FIG. 14 are timing diagrams illustrating impedance adjustment sequences according to the impedance adjustment operation of the semiconductor memory apparatus 2000 under external control. FIG. 13 is an example of a timing diagram of an impedance adjustment sequence for an operation mode of the semiconductor memory apparatus 2000 in the first impedance control mode ZQMODE1.

Referring to FIG. 13, an operation with a command included added to the initial training sequence to set the operation mode of the semiconductor memory apparatus 2000 to one of the first impedance control mode ZQMODE1 in which the code update operation is performed by the semiconductor memory apparatus 2000 and the second impedance control mode ZQMODE2 in which the code update operation is performed in response to a command from the controller 3000.

The controller 3000 transmits an impedance control mode setting command SETZQMODE to the semiconductor memory apparatus 2000 within the initial training sequence. The impedance control mode setting command SETZQMODE changes timing of the code update operation. While FIG. 13 shows an example including the impedance control mode setting command SETZQMODE between the boot-up sequence and the long-term impedance adjustment command ZQCL, the impedance control mode setting command SETZQMODE may be located anywhere between subsequences, such as between the long-term impedance adjustment command ZQCL and the training data TRNs.

In response to the impedance control mode setting command SETZQMODE, the semiconductor memory apparatus 2000 generates the control mode setting signal INF-ZQC described with reference to FIG. 7. An operation mode of the semiconductor memory apparatus 2000 is set to the first impedance control mode ZQMODE1 as shown in FIG. 13 according to the control mode setting signal INF-ZQC.

After the initial training sequence, the semiconductor memory apparatus 2000 performs the data output operation according to the read command RD simultaneously with either the short-term impedance adjustment operation ZQCSi as shown in FIG. 11 or the short-term impedance adjustment and comparison operation ZQCSi & CMPR as shown in FIG. 12.

Because the operation mode of the semiconductor memory apparatus 2000 is the first impedance control mode ZQMODE1, the code update operation described above is performed in response to deactivation of the data output enable signal ENDOUT and activation of the update determination signal CDV1 or CDV2 as shown in FIG. 11 or FIG. 12.

FIG. 14 is an example in which the operation mode of the semiconductor memory apparatus 2000 is the second impedance control mode ZQMODE2 according to the impedance control mode setting command SETZQMODE included in the initial training sequence.

Referring to FIG. 14, after the initial training sequence, the semiconductor memory apparatus 2000 performs the short-term impedance adjustment and comparison operation ZQCSi & CMPR as shown in FIG. 12 simultaneously with the data output operation according to the read command RD.

Because the operation mode of the semiconductor memory apparatus 2000 is the second impedance control mode ZQMODE2, the controller 3000 transmits a code read command ZQRD to the semiconductor memory apparatus 2000.

The semiconductor memory apparatus 2000 outputs the first impedance code set ZQPUCD, ZQPDCD and the second impedance code set TXPUCD, TXPDCD to the controller 3000 in response to the code read command ZQRD.

The controller 3000 provides the code update command ZQUDT to the semiconductor memory apparatus 2000, which command directs (facilitates) or prohibits a code update operation by determining a code value difference, such as a difference between the first impedance code set ZQPUCD, ZQPDCD and the second impedance code set TXPUCD, TXPDCD.

The semiconductor memory apparatus 2000 performs the code update operation when the code update command ZQUDT permits or facilitates the code update operation and does not perform the code update operation when the code update instruction ZQUDT prohibits the code update operation.

Figure 15:
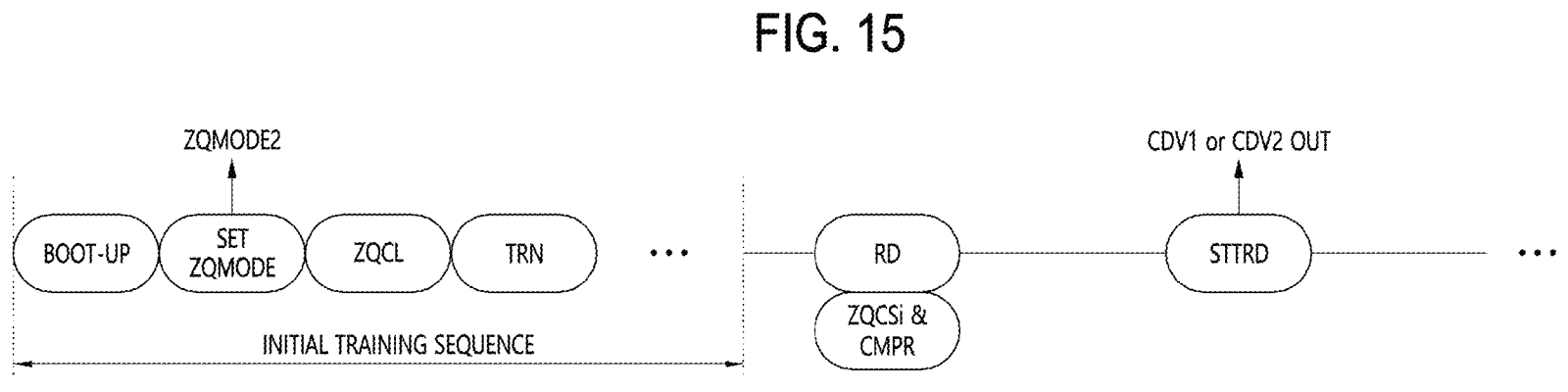

FIG. 15 is a timing diagram during a code status read operation when the operation mode of the semiconductor memory apparatus 2000 is the second impedance control mode ZQMODE2 according to the impedance control mode setting command SETZQMODE included in the initial training sequence.

Referring to FIG. 15, after the initial training sequence, the semiconductor memory apparatus 2000 performs the short-term impedance adjustment and comparison operation ZQCSi & CMPR as shown in FIG. 12 simultaneously with the data output operation according to the read command RD.

Because the operation mode of the semiconductor memory apparatus 2000 is the second impedance control mode ZQMODE2, the controller 3000 transmits a code status read command STTRD to the semiconductor memory apparatus 2000.

The semiconductor memory apparatus 2000 provides the update determination signal CDV1 or CDV2 as a flag signal to the controller 3000 in response to the code status read command STTRD.

The controller 3000 uses the flag signal to determine the impedance adjustment status of the semiconductor memory apparatus 2000 or directly controls the code update operation by providing the semiconductor memory apparatus 2000 with the code update command ZQUDT as shown in FIG. 14 based on the flag signal.

In an embodiment, a method may include generating a first impedance code set by performing an impedance adjustment operation during a time period for a read operation;

prevent updating a second impedance code set to the first impedance code set until the time period for a read operation is completed; and applying the second impedance code set to adjust impedance of a transmitting circuit for a semiconductor memory apparatus.

A person skilled in the art to which the present disclosure pertains can understand that the present disclosure may be carried out in other forms without changing the technical scope or essential features. The embodiments described above are illustrative in all aspects, not limitative. Therefore, the scope of the present disclosure should not be limited to the foregoing embodiments. All changes within the meaning and range of equivalency of the claims are included within their scope.

What is claimed is:

1. An impedance calibration circuit comprising:
a code generation circuit configured to generate a first impedance code set by performing an impedance adjustment operation within an activated period of a data output enable signal generated in response to a read command; and
a code update control circuit configured to prevent updating a second impedance code set to the first impedance code set until deactivation of the data output enable signal, wherein the second impedance code set is used in impedance adjustment of a transmitting circuit.

2. The impedance calibration circuit of claim 1, wherein the code generation circuit is configured to perform the impedance adjustment during an impedance adjustment period identified by a long-term impedance adjustment enable signal generated according to a long-term impedance adjustment command.

3. The impedance calibration circuit of claim 1, wherein the code generation circuit comprises:
a first replication circuit configured to adjust an impedance according to a first impedance pull-up code from the first impedance code set;
a first code adjustment circuit configured to adjust, during an activated period of an impedance adjustment enable signal, a value of the first impedance pull-up code based on a result from comparing a first reference voltage with a voltage of a first node to which the first replication circuit and a reference resistor are coupled;
a second replication circuit configured to adjust an impedance according to the first impedance pull-up code;
a third replication circuit configured to adjust an impedance according to a first impedance pull-down code from the first impedance code set;
a second code adjustment circuit configured to adjust, during the activated period of the impedance adjustment enable signal, a value of the first impedance pull-down code based on a result from comparing a second reference voltage with a voltage of a second node to which the second replication circuit and the third replication circuit are coupled; and
a logic circuit configured to generate the impedance adjustment enable signal in response to the data output enable signal and a long-term impedance adjustment enable signal.

4. The impedance calibration circuit of claim 3, wherein the first replication circuit and the second replication circuit are configured by replicating a pull-up driver of the transmitting circuit, and the third replication circuit is configured by replicating a pull-down driver of the transmitting circuit.

5. The impedance calibration circuit of claim 3, wherein the first code adjustment circuit comprises:
a first comparator configured to generate, during the activated period of the impedance adjustment enable signal, a first comparison signal based on the result from comparing the first reference voltage with the voltage of the first node; and
a first counter configured to one of increase and decrease the value of the first impedance pull-up code based on the first comparison signal.

6. The impedance calibration circuit of claim 1, wherein the code update control circuit comprises:
a latch circuit configured to update the second impedance code set to the first impedance code set in response to activation of an update enable signal; and
an update logic circuit configured to activate the update enable signal in response to at least one of a plurality of control signals, the first impedance code set, and the second impedance code set.

7. The impedance calibration circuit of claim 6, wherein the update logic circuit is configured to activate the update enable signal when the data output enable signal is deactivated.

8. The impedance calibration circuit of claim 6, wherein the update logic circuit is configured to activate the update enable signal when the data output enable signal is deactivated and the first impedance code set and the second impedance code set do not match each other.

9. The impedance calibration circuit of claim 6, wherein the update logic circuit is configured activate the update enable signal when the data output enable signal is deactivated and a difference between a value of the first impedance code set and a value of the second impedance code set is greater than a target value.

10. The impedance calibration circuit of claim 6, wherein the update logic circuit is configured to activate the update enable signal when a code update command is input.

11. The impedance calibration circuit of claim 6, wherein the update logic circuit is configured to activate the update enable signal when a long-term impedance adjustment enable signal is deactivated.

12. The impedance calibration circuit of claim 6, wherein the update logic circuit comprises:
a code operation circuit configured to generate an update determination signal based on a result from determining whether the first impedance code set and the second impedance code set match;
an update timing detection circuit configured to generate an update timing signal in response to the data output enable signal, a code update command, and a control mode setting signal; and
a logic gate configured to generate the update enable signal by performing a logical operation on the update determination signal and the update timing signal.

13. The impedance calibration circuit of claim 6, wherein the update logic circuit comprises:
a code operation circuit configured to generate an update determination signal based on a result from determining whether a difference value between the first impedance code set and the second impedance code set is greater than a target value;
an update timing detection circuit configured to generate an update timing signal in response to the data output enable signal, a code update command, and a control mode setting signal; and a logic gate configured to generate the update enable signal by performing a logical operation on the update determination signal and the update timing signal.

14. A semiconductor memory apparatus comprising:

a memory region;

a transmitting circuit configured to adjust an impedance according to a second impedance code set and configured to output data from the memory region during an activated period of a data output enable signal;

an impedance calibration circuit configured to perform an impedance adjustment operation within the activated period of the data output enable signal to generate a first impedance code set and configured to prevent updating the second impedance code set to the first impedance code set until deactivation of the data output enable signal; and a control circuit configured to activate the data output enable signal in response to a read command.

15. The semiconductor memory apparatus of claim 14, wherein the memory region comprises a plurality of logic units, wherein each of the plurality of logic units includes at least one memory die.

16. The semiconductor memory apparatus of claim 14, wherein the impedance calibration circuit comprises:

a latch circuit configured to update the second impedance code set to the first impedance code set in response to activation of an update enable signal; and an update logic circuit configured to activate the update enable signal in response to at least one of a plurality of control signals, the first impedance code set, and the second impedance code set.

17. The semiconductor memory apparatus of claim 16, wherein the update logic circuit comprises:

a code operation circuit configured to generate an update determination signal based on a result from determining whether the first impedance code set and the second impedance code set match;

an update timing detection circuit configured to generate an update timing signal in response to the data output enable signal, a code update command, and a control mode setting signal; and a logic gate configured to generate the update enable signal by performing a logical operation on the update determination signal and the update timing signal.

18. The semiconductor memory apparatus of claim 16, wherein the update logic circuit comprises:

a code operation circuit configured to generate an update determination signal based on a result from determining whether a difference value between the first impedance code set and the second impedance code set is greater than a target value;

an update timing detection circuit configured to generate an update timing signal in response to the data output enable signal, a code update command, and a control mode setting signal; and a logic gate configured to generate the update enable signal by performing a logical operation on the update determination signal and the update timing signal.

19. The semiconductor memory apparatus of claim 16, wherein the impedance calibration circuit further comprises:

a first replication circuit configured to adjust an impedance according to a first impedance pull-up code from the first impedance code set;

a first code adjustment circuit configured to adjust, during an activated period of an impedance adjustment enable signal, a value of the first impedance pull-up code based on a result from comparing a first reference voltage with a voltage of a first node to which the first replication circuit and a reference resistor are coupled;

a second replication circuit configured to adjust an impedance according to the first impedance pull-up code;

a third replication circuit configured to adjust an impedance according to a first impedance pull-down code from the first impedance code set;

a second code adjustment circuit configured to adjust, during the activated period of the impedance adjustment enable signal, a value of the first impedance pull-down code based on a result from comparing a second reference voltage with a voltage of a second node to which the second replication circuit and the third replication circuit are coupled; and a logic circuit configured to generate the impedance adjustment enable signal in response to the data output enable signal and a long-term impedance adjustment enable signal.

20. A memory system comprising:

a semiconductor memory apparatus comprising a transmitting circuit configured to adjust an impedance according to a second impedance code set, configured to perform an impedance adjustment operation within a data output period of the transmitting circuit in response to a read command to generate a first impedance code set, and configured to prevent a code update operation from updating the second impedance code set to the first impedance code set until the data output period is completed; and a controller configured to provide the semiconductor memory apparatus with an impedance control mode setting command to change timing of the code update operation.

21. The memory system of claim 20, wherein the controller is configured to set an operation mode of the semiconductor memory apparatus to a first impedance control mode using the impedance control mode setting command, and wherein the semiconductor memory apparatus is configured to perform the code update operation after completion of the data output period when the first impedance code set and the second impedance code set do not match during the first impedance control mode.

22. The memory system of claim 20, wherein the controller is configured to set an operation mode of the semiconductor memory apparatus to a first impedance control mode using the impedance control mode setting command, and wherein the semiconductor memory apparatus is configured to perform the code update operation after completion of the data output period when a difference value between the first impedance code set and the second impedance code set in the first impedance control mode is greater than a target value.

23. The memory system of claim 20, wherein the controller is configured to provide a code update command to the semiconductor memory apparatus after setting an operation mode of the semiconductor memory apparatus to a second impedance control mode using the impedance control mode setting command, and wherein the semiconductor memory apparatus is configured to perform the update operation in response to the code update command.

24. The memory system of claim 23, wherein the controller is configured to provide the semiconductor memory apparatus with a code read command prior to the code update command, and wherein the semiconductor memory apparatus is configured to provide at least one of the first impedance code set and the second impedance code set to the controller in response to the code read command and configured to perform the code update operation in response to the code update command.

25. The memory system of claim 20, wherein the controller is configured to provide a code status read command to the semiconductor memory apparatus, and wherein the semiconductor memory apparatus, in response to the code status read command, is configured to provide a flag signal to the controller identifying one of whether the first impedance code set and the second impedance code set match and whether a difference value between the first impedance code set and the second impedance code set is greater than a target value.

26. The memory system of claim 20, wherein the semiconductor memory apparatus comprises:

a memory region;

the transmitting circuit configured to adjust the impedance according to the second impedance code set and configured to output data from the memory region during an activated period of a data output enable signal;

an impedance calibration circuit configured to perform the impedance adjustment operation within the activated period of the data output enable signal to generate the first impedance code set and configured to prevent updating the second impedance code set to the first impedance code set until deactivation of the data output enable signal; and a control circuit configured to set an operation mode of the semiconductor memory apparatus to one of a first impedance control mode and a second impedance control mode in response to the impedance control mode setting command and configured to activate the data output enable signal in response to the read command.

27. The memory system of claim 20, wherein the semiconductor memory apparatus comprises:

a latch circuit configured to update the second impedance code set to the first impedance code set in response to activation of an update enable signal; and an update logic circuit configured to activate the update enable signal in response to at least one of a plurality of control signals, the first impedance code set, and the second impedance code set.

28. The memory system of claim 27, wherein the update logic circuit comprises:

a code operation circuit configured to generate an update determination signal based on a result from determining whether the first impedance code set and the second impedance code set match;

an update timing detection circuit configured to generate an update timing signal in response to the data output enable signal, a code update command, and a control mode setting signal; and a logic gate configured to generate the update enable signal by performing a logical operation on the update determination signal and the update timing signal.

29. The memory system of claim 27, wherein the update logic circuit comprises:

a code operation circuit configured to generate an update determination signal based on a result from determining whether a difference value between the first impedance code set and the second impedance code set is greater than a target value;

an update timing detection circuit configured to generate an update timing signal in response to the data output enable signal, a code update command, and a control mode setting signal; and a logic gate configured to generate the update enable signal by performing a logical operation on the update determination signal and the update timing signal.

* * * * *